(12) United States Patent
Mokhlesi et al.

(10) Patent No.: US 7,551,477 B2
(45) Date of Patent: Jun. 23, 2009

(54) MULTIPLE BIT LINE VOLTAGES BASED ON DISTANCE

(75) Inventors: Nima Mokhlesi, Los Gatos, CA (US); Dengtao Zhao, Sunnyvale, CA (US); Man Mui, Santa Clara, CA (US); Hao Nguyen, San Jose, CA (US); Seungpil Lee, San Ramon, CA (US); Deepak Chandra Sekar, Atlanta, GA (US); Tapan Samaddar, Santa Clara, CA (US)

(73) Assignee: SanDisk Corporation, Milpitas, CA (US)

( * ) Notice: Subject to any disclaimer, the term of this patent is extended or adjusted under 35 U.S.C. 154(b) by 103 days.

(21) Appl. No.: 11/861,571

(22) Filed: Sep. 26, 2007

(65) Prior Publication Data

US 2009/0080265 A1 Mar. 26, 2009

(51) Int. Cl.
*G11C 11/34* (2006.01)
(52) U.S. Cl. ..................... 365/185; 365/63; 365/230.03
(58) Field of Classification Search ............ 365/185.11, 365/63, 230.03
See application file for complete search history.

(56) References Cited

U.S. PATENT DOCUMENTS

| | | | |
|---|---|---|---|
| 5,673,223 A | 9/1997 | Park | |
| 6,351,423 B2 | 2/2002 | Ooishi | |
| 6,760,255 B2 * | 7/2004 | Conley et al. | 365/185.11 |
| 7,196,928 B2 | 3/2007 | Chen | |
| 7,224,607 B2 * | 5/2007 | Gonzalez et al. | 365/185.11 |
| 2002/0118588 A1 | 8/2002 | Kato | |
| 2003/0161174 A1 | 8/2003 | Kouichi | |
| 2004/0057285 A1 | 3/2004 | Cernea | |
| 2004/0057287 A1 | 3/2004 | Cernea | |
| 2004/0057318 A1 | 3/2004 | Cernea | |

FOREIGN PATENT DOCUMENTS

EP 1341182 9/2003

* cited by examiner

*Primary Examiner*—Son Dinh
(74) *Attorney, Agent, or Firm*—Vierra Magen Marcus & DeNiro LLP

(57) ABSTRACT

An array of non-volatile storage elements includes a first group of non-volatile storage elements connected to a selected word line, a second group of non-volatile storage elements connected to the selected word line, a first group of bit lines in communication with the first group of non-volatile storage elements, a second group of bit lines in communication with the second group of non-volatile storage elements, a first set of sense modules located at a first location and connected to the first group of bit lines, and a second set of sense modules located at a second location and connected to the second group of bit lines. The first set of sense modules applies a first bit line voltage based on the bit line distance between the first set of sense modules and the first group of non-volatile storage elements. The second set of sense modules applies a second bit line voltage based on the bit line distance between the second set of sense modules and the second group of non-volatile storage elements.

49 Claims, 11 Drawing Sheets

MULTIPLE BIT LINE VOLTAGES BASED ON DISTANCE

BACKGROUND

1. Field

The present invention relates to technology for non-volatile storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize memory cells that comprise a transistor with a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate. Thus, a memory cell (which can include one or more transistors) can be programmed and/or erased by changing the level of charge on a floating gate in order to change the threshold voltage.

Typically, memory cells are arranged in columns and rows to form an array. Various control lines can be used to access and/or control the memory cells. In NAND flash memory, for example, bit lines connect to columns of memory cells and word lines connect to rows of memory cells. However, other arrangements can also be used.

When reading memory cells, various voltages are applied to the memory cells to determine whether the memory cells conduct in response to the conditions set up by the applied voltages. In the example of NAND flash memory, a bit line associated with a memory cell is pre-charged and read compare voltage is applied to a control gate of the memory cells. A sense circuit is then used to determine whether the memory cell conducted in response to the read compare voltage by sensing current flow or voltage changes on the bit line.

In some architectures, the same voltages will be applied to all memory cells being read. However, some memory cells will need a higher voltage while others may only need a lower voltage. For example, those memory cells farther from the voltage source may see a lower voltage due to line resistance. To overcome the voltage drop due to line resistance, a larger voltage must be driven. Since most systems apply the same voltages to all memory cells via their associated control lines, all of the memory cells will typically then receive the larger voltage.

It is beneficial, however, to minimize bit line voltages during read in order to reduce power consumption, reduce cell source loading and improve speed of operation. It is similarly beneficial to reduce the voltages used for other control lines in other arrangements of non-volatile storage.

SUMMARY

The technology described herein allows for reduced voltages on control lines when operating non-volatile storage. One example includes driving different bit line voltages for different memory cells being read based on the distance of those memory cells (or their associated word line) from the circuit that provides the bit line voltage. In this manner, those memory cells that need a larger bit line voltage to be driven due to line resistance will have that larger bit line voltage applied to the associated bit lines and those memory cells that do not need a larger bit line voltage driven will have a lower bit line voltage applied to their bit lines. By applying a lower voltage to at least some of the bit lines, power consumption is reduced, cell source loading is reduced, and performance is improved. A similar approach can be used with other control lines.

One embodiment includes a plurality of bit lines, non-volatile storage elements including a first group of one or more non-volatile storage elements connected to a first set of one or more of the bit lines and a second group of one or more non-volatile storage elements connected to a second set of one or more of the bit lines, and a plurality of bit line interface circuits including a first group of one or more bit line interface circuits connected to the first set of one or more bit lines and a second group of one or more bit line interface circuits connected to the second set of the one or more bit lines. The first group of one or more bit line interface circuits provide a first signal to the first set of bit lines based on distance of the first group of one or more non-volatile storage elements from the first group of one or more bit line interface circuits. The second group of one or more bit line interface circuits provide a second signal to the second set of bit lines based on distance of the second group of one or more non-volatile storage elements from the second group of one or more bit line interface circuits.

One embodiment includes a plurality of non-volatile storage elements including a first subset of non-volatile storage elements and a second subset of non-volatile storage elements, a first set of control lines in communication with the first subset of non-volatile storage elements, a second set of control lines in communication with the second subset of non-volatile storage elements, and one or more managing circuits in communication with the non-volatile storage elements. The one or more managing circuits apply a first voltage to the first subset of control lines based on position of the first subset of non-volatile storage elements in the plurality while applying a second voltage to the second set of control lines based on position of the second subset of non-volatile storage elements in the plurality as part of a common read operation. The one or more managing circuits sense data in the first set of selected non-volatile storage elements and the second set of selected non-volatile storage elements during the common read operation.

One embodiment includes a plurality of bit line interface circuits. Each bit line interface circuit connects to one of a plurality of bit lines. The plurality of bit line interface circuits are divided into at least a first group of bit line interface circuits connected to a first set of bit lines and a second group of bit line interface circuits connected to a second set of bit lines. A first variable signal providing circuit is in communication with the first group of bit line interface circuits. The first variable signal providing circuit provides a first signal to the first group of bit line interface circuits based on a location of non-volatile storage elements associated with the first group of bit line interface circuits that have been selected for a read operation. The first group of bit line interface circuits provide a first bit line signal to the first set of bit lines based on the first signal. A second variable signal providing circuit is in communication with the second group of bit line interface circuits. The second signal voltage providing circuit provides a second signal to the second group of bit line interface circuits based on a location of non-volatile storage elements associated with the second group of bit line interface circuits that have been selected for the read operation. The second group of bit line interface circuits provide a second bit line signal to the second set of bit lines based on the second signal.

One embodiment includes a word line, an array of non-volatile storage elements that includes a first group of non-volatile storage elements connected to the word line and a second group of non-volatile storage elements connected to the word line, a plurality of bit lines including a first group of bit lines in communication with the first group of non-volatile storage elements and a second group of bit lines in communication with the second group of non-volatile storage elements, a first set of sense modules connected to the first group of bit lines and located on a first side of the array, a second set of sense modules connected to the second group of bit lines and located on a different side of the array than the first set of sense modules, a first control circuit in communication with the first set of sense modules, and a second control circuit in communication with the second set of sense modules. The first control circuit provides a first signal to the first set of sense modules based on a location of first group of non-volatile storage elements in the array. The first set of sense modules provide a first voltage to the first group of bit lines based on the first signal. The second control circuit provides a second signal to the second set of sense modules based on a location of second group of non-volatile storage elements in the array. The second set of sense modules provide a second voltage to the second group of bit lines based on the second signal.

One embodiment includes a method of providing a first control line signal to a first set of one or more control lines from a first set of one or more control line interface modules based on distance of the first set of one or more control line interface modules from a first set of one or more selected non-volatile storage elements in communication with the first set of one or more control lines, providing a second control line signal to a second set of one or more control lines from a second set of one or more control line interface modules based on distance of the second set of one or more control line interface modules from a second set of one or more selected non-volatile storage elements in communication with the second set of one or more control lines, and performing a memory operation on the first set of one or more selected non-volatile storage elements and the second set of one or more selected non-volatile storage elements during a common parallel process based on the first control line signal and the second control line signal.

One embodiment includes providing a first bit line voltage to a first set of bit lines from a first set of bit line interface modules based on distance along the first set of bit lines between the first set of bit line interface modules and a first set of selected non-volatile storage elements in communication with the first set of bit lines and providing a second bit line voltage to a second set of bit lines from a second set of bit line interface modules based on distance along the second set of bit lines between the second set of bit line interface modules and a second set of selected non-volatile storage elements in communication with the second set of bit lines. The second bit line voltage is provided to the second set of bit lines and the first bit line voltage is provided to the first set of bit lines as part of a common read process for the first set of selected non-volatile storage elements and the second set of selected non-volatile storage elements. The process further includes sensing data in the first set of selected non-volatile storage elements and the second set of selected non-volatile storage elements during the common read process.

One embodiment includes providing a first bit line voltage to a first set of bit lines in communication with a first set of selected non-volatile storage elements and providing a second bit line voltage to a second set of bit lines in communication with a second set of selected non-volatile storage elements. The first set of selected non-volatile storage elements are connected to the second set of selected non-volatile storage elements. The first bit line voltage is based on position of the first set of selected non-volatile storage elements in a group of non-volatile storage elements. The second bit line voltage is based on position of the second set of selected non-volatile storage elements in the group of non-volatile storage elements. Data is sensed in the first set of selected non-volatile storage elements based on the first bit line voltage. Data is sensed in the second set of selected non-volatile storage elements based on the second bit line voltage while sensing data in the first set of selected non-volatile storage elements based on the first bit line voltage.

One embodiment includes accessing an address for a read operation, determining a set of two or more bit line voltages based on position in a memory array of a set of non-volatile storage elements associated with the address (the set of two or more bit line voltages includes a first bit line voltage and a second bit line voltage), storing one or more parameters indicating the two or more bit line voltages, using the stored parameters to program a first voltage providing circuit and a second voltage providing circuit, providing the first bit line voltage to a first set of bit lines using the first voltage providing circuit, providing the second bit line voltage to a second set of bit lines using the second voltage providing circuit in a manner that overlaps in time with providing the first bit line voltage to the first set of bit lines, and sensing data in the first set of selected non-volatile storage elements and the second set of selected non-volatile storage elements using the first and second bit line voltages.

DETAILED DESCRIPTION

Figure 1:
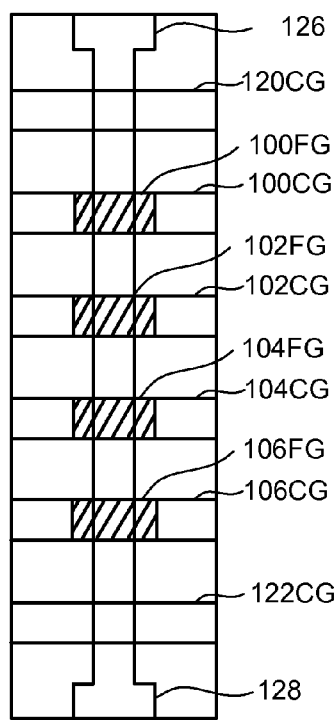
FIG. 1 is a top view of a NAND string.
Figure 2:
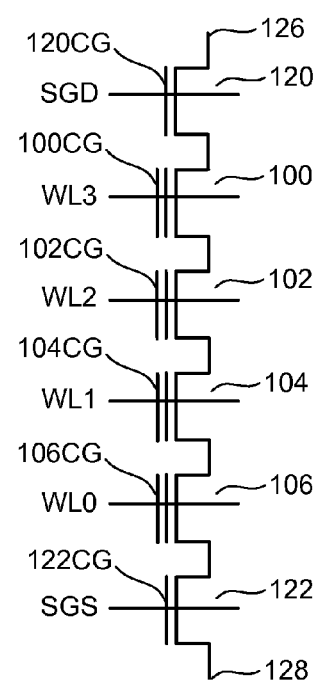
FIG. 2 is an equivalent circuit diagram of the NAND string.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS. Each NAND string is connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Relevant examples of NAND type flash memories and their operation are provided in the following U.S. patents/patent applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. The discussion herein can also apply to other types of flash memory in addition to NAND, as well as other types of non-volatile memory. For example, another type of flash memory uses the NOR architecture.

Other types of non-volatile storage devices, in addition to NAND flash memory, can also be used. For example, non-volatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, Nov. 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric. Other types of non-volatile storage can also be used.

When programming a flash memory device, such as a NAND flash memory device, a program voltage Vpgm is typically applied to the control gate of the memory cell and the bit line is grounded. Electrons from the channel are injected into the floating gate. When electrons accumulate in the floating gate, the floating gate becomes negatively charged and the threshold voltage of the memory cell is raised so that the memory cell is in a programmed state. Typically, the program voltage applied to the control gate during a program operation is applied as a series of pulses. In many implementations, the magnitude of the pulses is increased with each successive pulse by a predetermined step size. Between pulses, one or more verify operations are performed. More information about programming can be found in the following U.S. patents which are incorporated herein by reference in their entirety. U.S. Pat. Nos. 6,859,397; 7,187,585; and 7,035,146.

Memory cells are erased in one embodiment by raising the p-well to an erase voltage (e.g., 20 volts) for a sufficient period of time and grounding the word lines of a selected block of memory cells while the source and bit lines are floating. Due to capacitive coupling, the unselected word lines, bit lines, select lines, and the common source line are also raised to a significant fraction of the erase voltage. A strong electric field is thus applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of cells.

In general, during verify operations and read operations, the selected word line is connected to a voltage, a level of which is specified for each read and verify operation in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage on the bit line is measured after a period of time to see whether it has been discharged or not.

Each memory cell can store data (analog or digital). When storing one bit of digital data (referred to as a binary memory cell), possible threshold voltages of the memory cell are divided into two ranges which are assigned logical data "1" and "0." In one example of a NAND type flash memory, the threshold voltage is negative after the memory cell is erased, and defined as logic "1." After programming, the threshold voltage is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple levels of information (referred to as a multi-state memory cell or multi-level cell). In the case of storing multiple levels of data, the range of possible threshold voltages is divided into the number of levels of data. For example, if four levels of information is stored, there will be four threshold voltage ranges assigned to the data values "11", "10", "01", and "00." In one example of a NAND type memory, the threshold voltage after an erase operation is negative and defined as "11." Positive threshold voltages are used for the states of "10", "01", and "00." If eight levels of information (or states) are stored in each memory cell (e.g. for three bits of data), there will be eight threshold voltage ranges assigned to the data values "000", "001", "010", "011" "100", "101", "110" and "111." The specific relationship between the data programmed into the memory cell and the threshold voltage levels of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted to reduce data pattern sensitivity and even wear on the memory cells. Different encoding schemes can be used.

Figure 3:
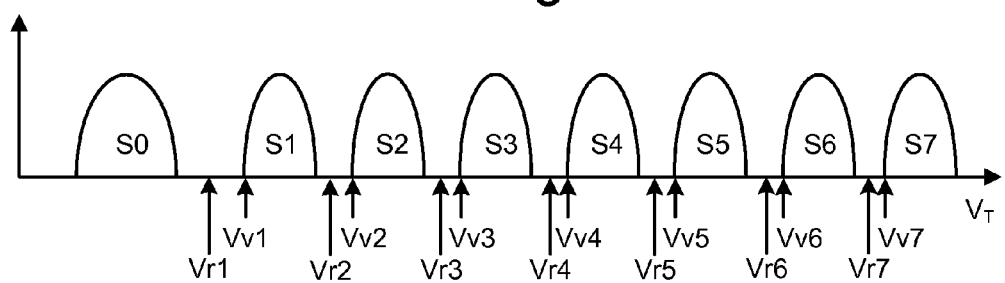
FIG. 3 depicts an example set of threshold voltage distributions.

At the end of a successful programming process (with verification), the threshold voltages of the memory cells should be within one or more distributions of threshold voltages for programmed memory cells or within a distribution of threshold voltages for erased memory cells, as appropriate. FIG. 3 illustrates example threshold voltage distributions (or data states) for the memory cell array when each memory cell stores three bits of data. Other embodiment, however, may use more or less than three bits of data per memory cell (e.g., such as four or more bits of data per memory cell).

In the example of FIG. 3, each memory cell stores three bits of data; therefore, there are eight valid data states S0-S7. In one embodiment, data state S0 is below 0 volts and data states S1-S7 are above 0 Volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mapping of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page and a third page. In some embodiments, all of the memory cells connected to the same word line would store data in the same three pages of data. In some embodiments, the memory cells connected to a word line can be grouped in to different sets of pages (e.g., by odd and even bit lines).

In some example implementations, the memory cells will be erased to state S0. From state S0, the memory cells can be programmed to any of states S1-S7. As discussed above, programming is performed by applying a set of pulses with rising magnitudes to the control gates of the memory cells. Between pulses, a set of verify operations are performed to determined whether the memory cells being programmed have reached their target threshold voltage. For example, FIG. 3 shows verify levels Vv1, Vv2, Vv3, Vv4, Vv5, Vv6, and Vv7. Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data multiple reads will be performed at read compare points Vr1, Vr2, Vr3, Vr4, Vr5, Vr6, and Vr7 to determine which state the memory cells are in. If a memory cell turns on in response to Vr1, it is in state S0. If a memory cell turns on in response to Vr2 but does not turn on in response to Vr1, it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 4:
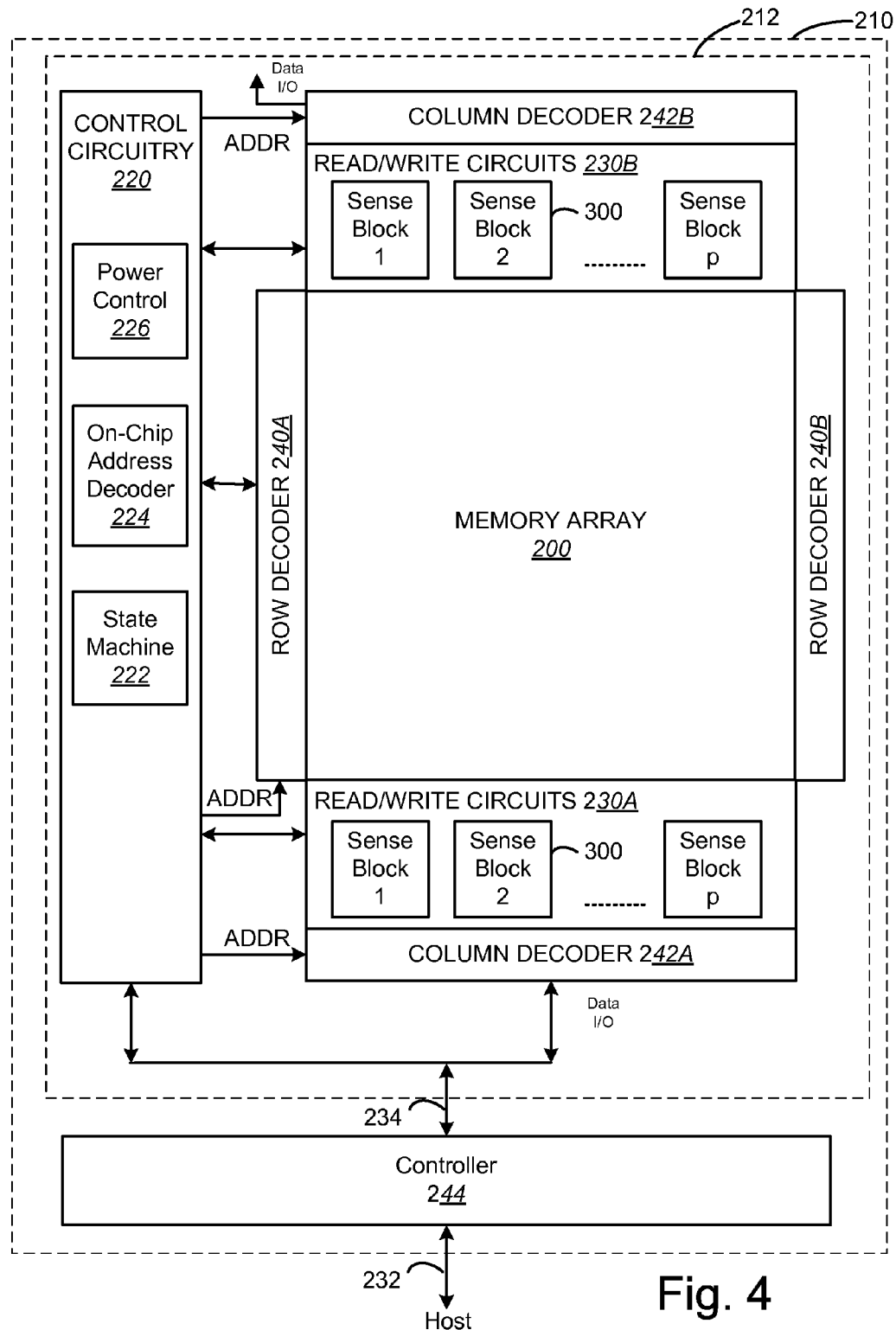
FIG. 4 is a block diagram of a non-volatile memory system.

FIG. 4 illustrates a memory device 210 having read/write circuits for reading and programming memory cells. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits. The one or more managing circuits perform the processes described herein.

Figure 5:
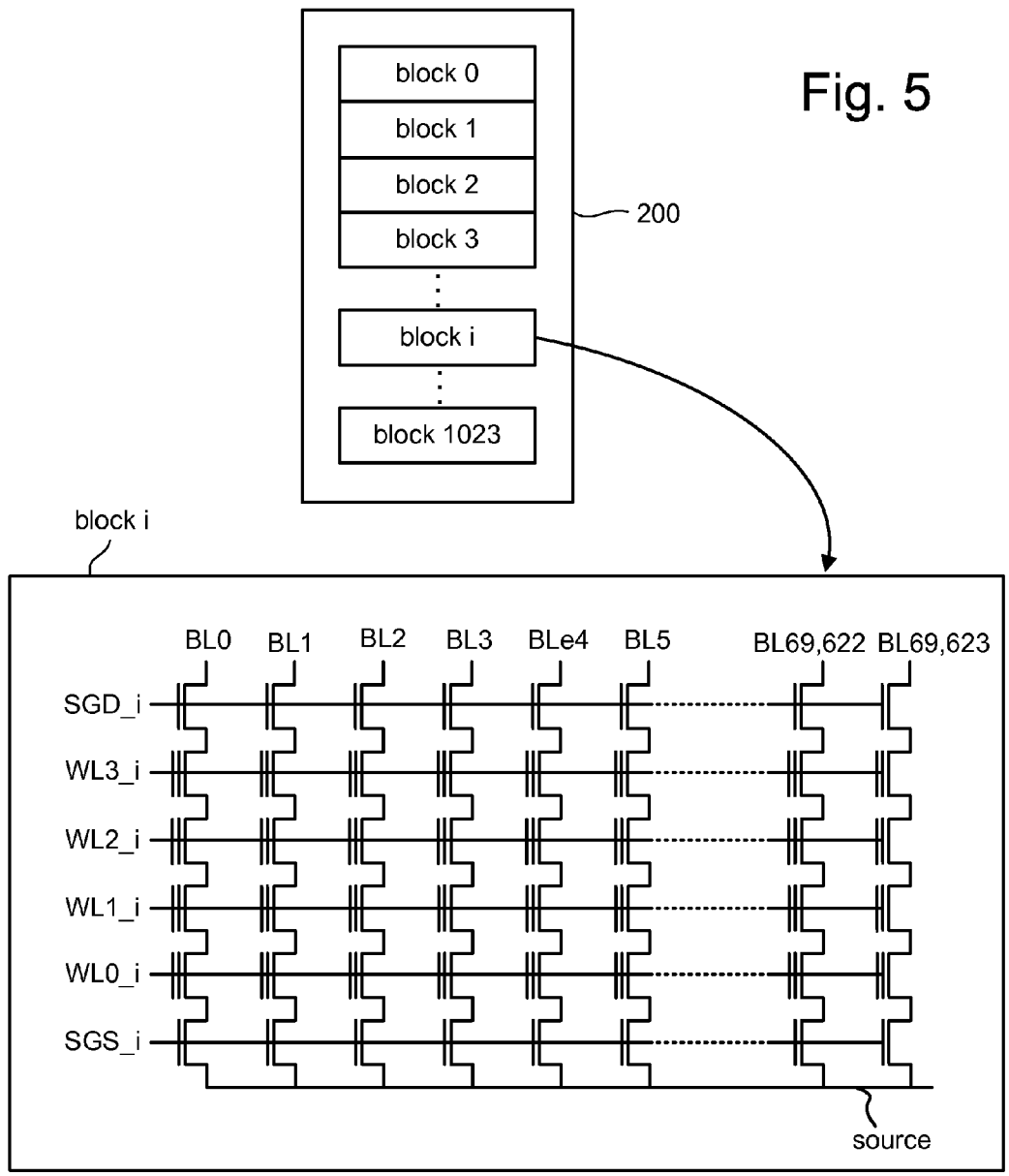
FIG. 5 is a block diagram depicting one embodiment of a memory array.

FIG. 5 depicts an exemplary structure of memory cell array 200. In one embodiment, the array of memory cells is divided into a large number of blocks (e.g., blocks 0-1023, or another amount of blocks) of memory cells. As is common for flash memory systems, the block is the unit of erase. That is, each block contains the minimum number of memory cells that are erased together. In other embodiments, other units of erase can be used.

A block contains a set of NAND stings which are accessed via bit lines (e.g., bit lines BL0-BL69623) and word lines (WL0, WL1, WL2, WL3). FIG. 4 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time. In other embodiments, all memory cells connected to a word line can be programmed and read together. Although FIG. 5 shows 69,624 bit lines, more or less than that number can be used. The exact number of bit lines is not necessary with the technology described herein.

Each block is typically divided into a number of pages. In one embodiment, a page is a unit of programming. One or more pages of data are typically stored in one row of memory cells. For example, one or more pages of data may be stored in memory cells connected to a common word line. A page can store one or more sectors. A sector includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used.

Figure 6:
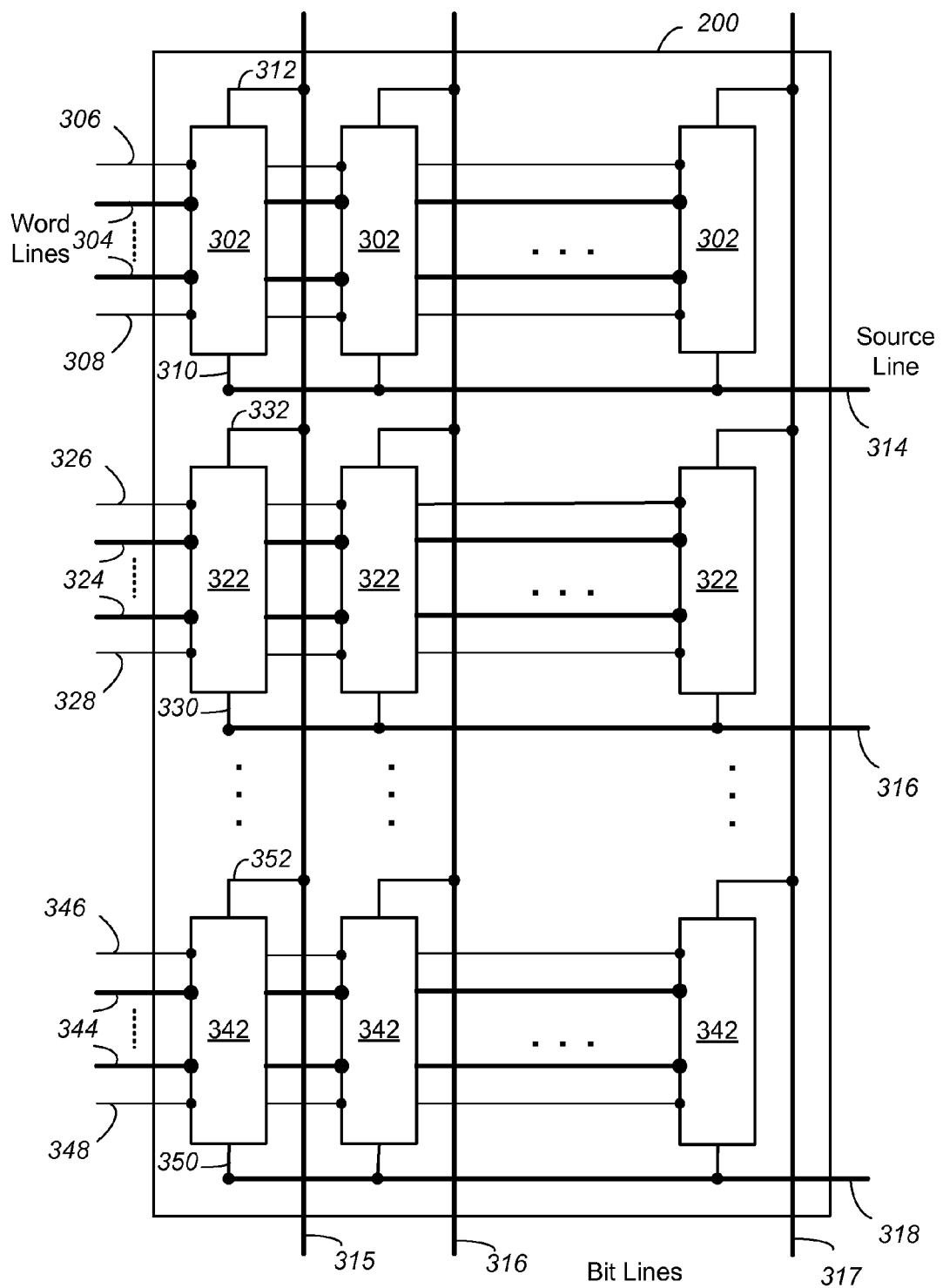
FIG. 6 depicts a set of NAND strings.

FIG. 6 provides another view of memory cell array 200, illustrating multiple NAND strings. Each row of NAND strings form a block. For example, NAND strings 302 form a block, NAND strings 322 form a block, and NAND strings 342 form a block. Along each column of NAND strings, a bit line (315, 316, 317) is coupled to the drain terminal of each NAND string. For example, bit line 315 is coupled to the drain terminal of NAND string 302 via connection 312, to the drain terminal of NAND string 322 via connection 332, and to the drain terminal of NAND string 342 via connection 352.

Along each bank of NAND strings, a source line (such as source lines 314, 316, 318) is coupled to the source terminals (310, 330, 350) of each NAND string. Also the control gates along a row of memory cells in a bank of NAND strings are connected to a word line, such as word lines 304, 324 and 344. The control gates along a row of select transistors in a bank of NAND strings are connected to a select line such as drain side select lines 306, 326 and 346 and source side select lines 308, 328 and 348. An entire row of memory cells in a bank of NAND strings can be addressed by appropriate voltages on the word lines and select lines. When a memory transistor within a NAND string is being read, the remaining memory transistors in the string are turned on hard via their associated word lines so that the current flowing through the string is essentially dependent upon the level of charge stored in the cell being read.

Figure 7:
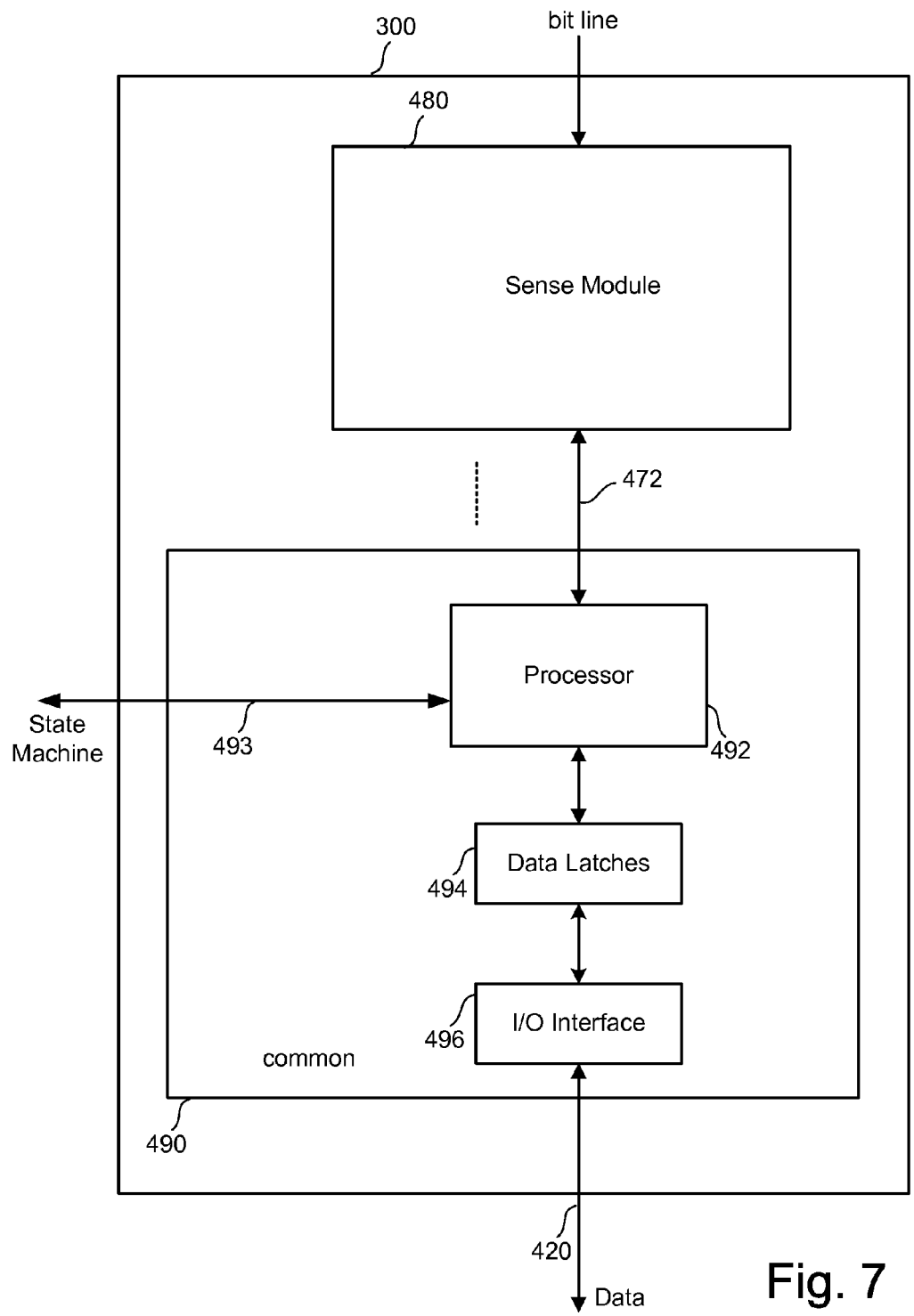
FIG. 7 is a block diagram depicting one embodiment of a sense block.

FIG. 7 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block 300 will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls (using power control 226) the supply of different control gate voltages to the addressed memory cell(s). As it steps through the various predefined control gate voltages (e.g., Vr1, Vr2, Vr3, Vr4, Vr5, Vr6, Vr7) corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494.

It is anticipated that some implementations will include multiple processors 492. In one embodiment, each processor 492 will include an output line (not depicted in FIG. 7) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is includes in processor 492 to accumulate the results of the associated bit lines such that the state machine need only read the wired-OR line one time.

Data latch stack 494 contains a stack of data latches corresponding to the sense module. In one embodiment, there are three (or four or another number) data latches per sense module 480. In one embodiment, the latches are each one bit.

During program or verify, the data to be programmed is stored in the set of data latches 494 from the data bus 420. During the verify process, Processor 492 monitors the verified memory state relative to the desired memory state. When the two are in agreement, processor 492 sets a bit line latch (not depicted in FIG. 7) to cause the bit line to be pulled to a state designating program inhibit (e.g., supply voltage). This inhibits the cell coupled to the bit line from further programming even if it is subjected to programming pulses on its control gate.

In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the sensing operations and sense amplifiers can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Publication 2006/0221692, titled "Compensating for Coupling During Read Operations of Non-Volatile Memory," Inventor Jian Chen, filed on Apr. 5, 2005; and (5) U.S. Patent Application Pub. No. 20060158947, titled "Reference Sense Amplifier For Non-Volatile Memory, Inventors Siu Lung Chan and Raul-Adrian Cernea. All five of the immediately above-listed patent documents are incorporated herein by reference in their entirety.

Figure 8:
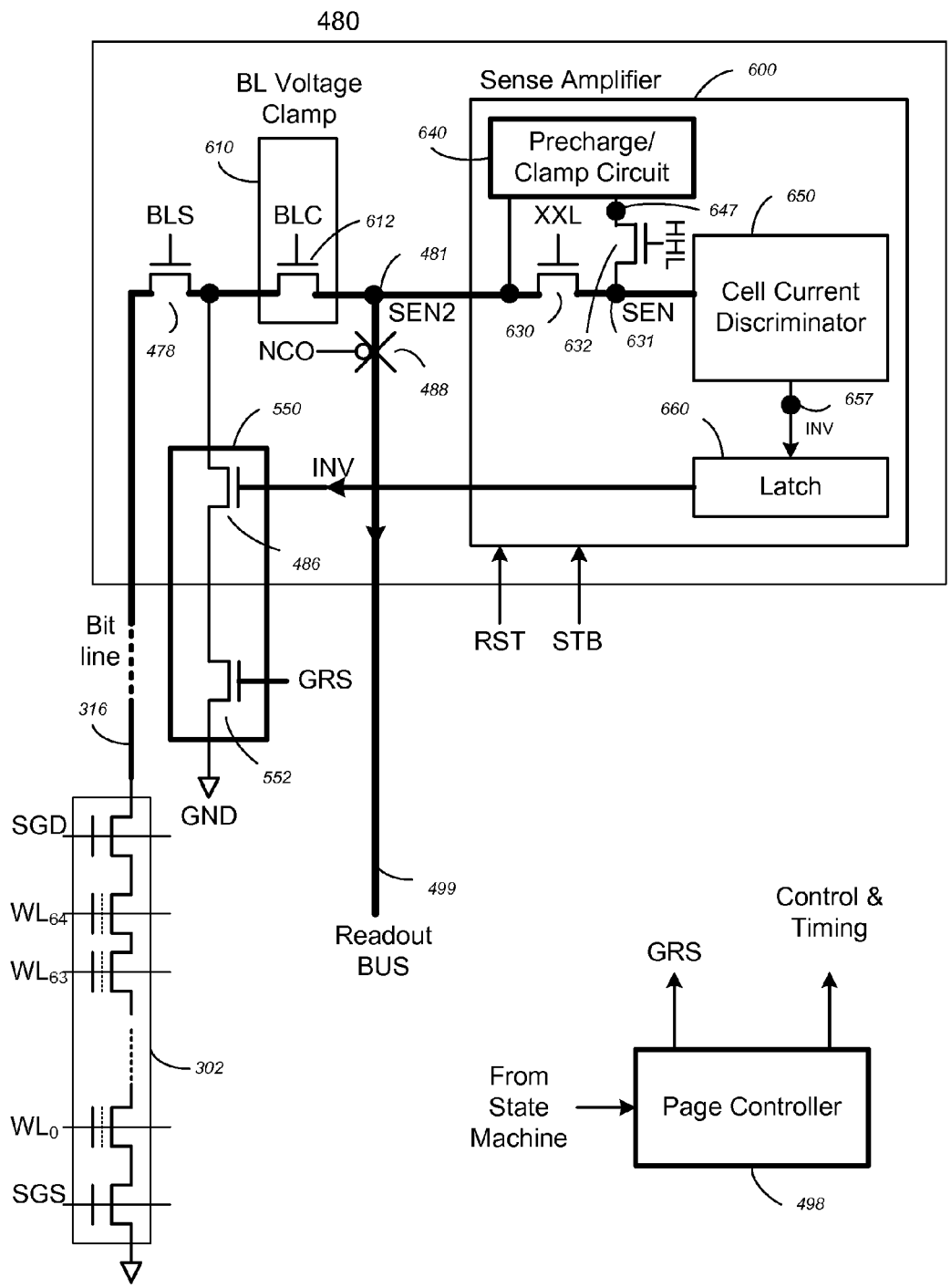
FIG. 8 is a schematic diagram of a sense module.

FIG. 8 illustrates schematically in more detail sense module 480, which senses the conduction current of a memory cell in a NAND string 302 via a coupled bit line. Sense Module 480 has a sense node 481 that can be selectively coupled to a bit line, a sense amplifier 600 and a readout bus 499. An isolation transistor 478, when enabled by a signal BLS, connects the bit line 316 to the sense node 481. The sense amplifier 600 senses the sense node 481. Sense amplifier 600 includes a pre-charge/clamp circuit 640, a cell current discriminator 650, and a latch 660. Sense module 480 enables the conduction current of the selected memory cell in the NAND string 302 to be sensed.

A pull-down circuit 550, which includes transistors 486 and 552, is provided for selectively pulling the bit line 316 to ground. The pull-down circuit 550 is activated when both the signal INV and another signal GRS are both HIGH. The signal GRS, which is control from the state machine 222, is supplied as part of the control and timing signals from the page controller 498. Signal GRS may be regarded as the control signal by the state machine to enable (GRS=HIGH) or disable (GRS=LOW) the pull-down circuit 550 in order to respectively enable or disable the locking out of high-current bit-lines. When the sensing indicates a high-current state, INV will be HIGH and if the pull-down circuit is enabled, it will pull-down the bit line.

One feature of the sense module 480 depicted in FIG. 8 is the incorporation of a constant voltage supply to the bit line during sensing. This is preferably implemented by the bit line voltage clamp 610. The bit line voltage clamp 610 operates like a diode clamp with transistor 612 in series with the bit line 316. Its gate is biased to a constant voltage BLC. The signal BLC is set at BLC=VBL+Vt612, where VBL is the desired bit line voltage and Vt612 is the threshold voltage of transistor 612. In this way, it isolates the bit line from the sense node 631 and sets a constant voltage level for the bit line, such as the desired VBL=0.5 to 0.7 volts during verifying or reading. In general, the bit line voltage level is set to a level such that it is sufficiently low to avoid a long pre-charge time, yet sufficiently high to avoid ground noise and other factors.

Prior to sensing, the voltages to the electrodes of the selected memory cell must be set via the appropriate word lines and bit line in one or more pre-charge operations. For example, a page of memory cells along a word line may be selected for sensing (e.g., during read or verify). The pre-charge operation starts with the unselected word lines being charged to a voltage Vread and the selected world line being charged to a predetermined threshold voltage VT(i) for a given memory state under consideration. Then, the bit line pre-charge circuit 640 brings the bit line 316 to a predetermined drain voltage appropriate for sensing. This will induce a source-drain conduction current to flow in the selected memory cell in the NAND string, which is detected from the channel of the NAND string 302 via a coupled bit line 316. The conduction current is a function of the charge programmed into the selected memory cell and the applied VT(i) when there exists a nominal voltage difference between the source and drain of the memory cell.

Figure 9:
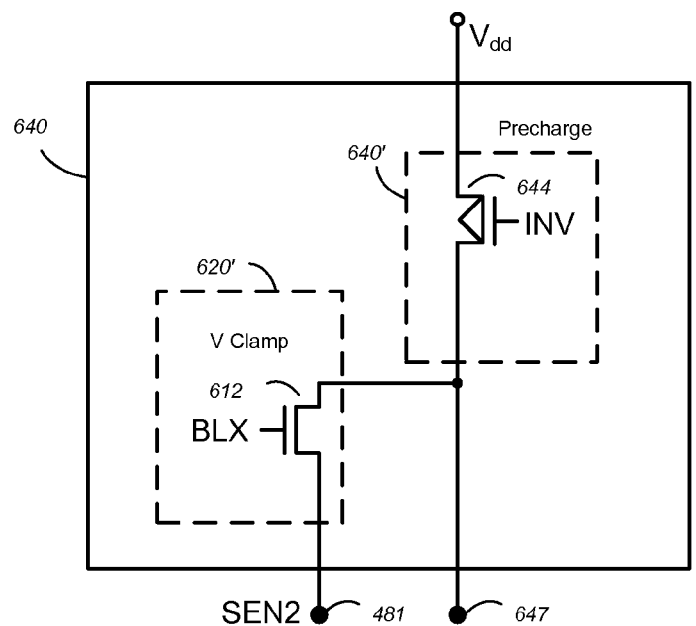
FIG. 9 is a schematic diagram of a pre-charge/clamp circuit.

FIG. 9 illustrates in more detail the Pre-charge/Clamp circuit 640 shown in FIG. 8. The circuit has a voltage clamp 620' component and a pre-charge circuit 640' component. The voltage clamp 620' is implemented by a transistor 612 controlled by an analog signal BLX at its gate. BLX is such that it ensures sufficient voltage on the node SEN2 481 (see FIG. 8) so that the bit line voltage clamp 610 can function properly. The pre-charge circuit 640' is implemented by transistor 644 controlled by the signal INV at its gate.

When the VT(i) voltage is stable, the conduction current or the programmed threshold voltage of the selected memory cell can be sensed via the coupled bit line 316 via the transistor 630 gated by a signal XXL.

Figure 10:
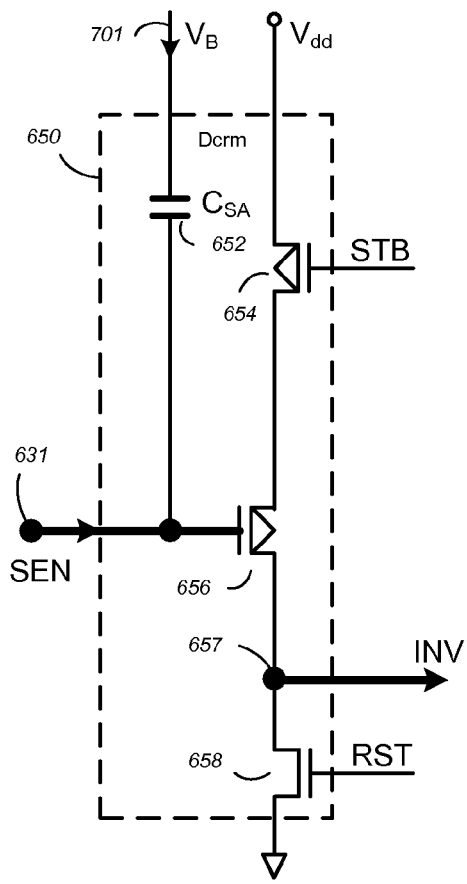
FIG. 10 is a block diagram of a portion of the non-volatile memory system.

The cell current discriminator 650 serves as a discriminator or comparator of current levels. It is coupled to the sense node to sense the conduction current in the memory cell. FIG. 10 illustrates in more detail cell current discriminator circuit 650. Cell current discriminator 650 includes a capacitor 652, p-channel transistor 656, transistors 654 and transistor 658. The cell current discriminator essentially measures the conduction current of a memory cell by the rate it charges or discharges the capacitor 652. This is accomplished by sensing the signal SEN at the node 631. The signal SEN controls the gate of the p-transistor 656. Prior to sensing, SEN is pre-charged to Vdd (HIGH) by the pre-charge circuit 640'. Referring also to FIG. 8, the pre-charge is enabled by a signal HHL turning on the coupling transistor 632 so that the node SEN 651 is coupled to the pre-charge circuit 640' at node 647. This will initially set the voltage across the capacitor 652 to be zero. Sensing is then accomplished by measuring the cell's conduction current by the rate it discharges the capacitor.

During sensing, the conduction current of the memory storage unit in the bit line will discharge the capacitor 652. The voltage in the node SEN will then decrease from Vdd at a rate depending on the conduction current. After a predetermined discharging period, the period being corresponding to a reference current, SEN will drop to some value that may or may not turn on the measuring p-transistor 656. If it drops sufficiently low to turn on the p-transistor 656, it will mean that the conduction current is higher than the reference current. This will also result in the INV signal pulled HIGH when the signal STB is asserted. On the other hand, if the transistor 656 is not turned on at the end of the sensing period, the conduction current is lower than the reference current and the signal INV will be LOW. Referring also to FIG. 8. 10, the end of the sensing period is marked by decoupling the bit line from the SEN node with XXL turning off the coupling transistor 630. The sensed result is then latched into the latch 650 by a strobe signal STB.

The cell current discriminator 650 effectively determines whether the cell's conduction current is higher or lower than a given demarcation current value. The given demarcation current value corresponds to a predetermined discharge time. If the sensed current is higher than the demarcation current value, the latch 660 is set to a predetermined state with the signal INV=1 (HIGH). This also means the memory cell in question has a threshold value less than the applied VT(i) at the control gate.

In general, there will be a page of memory cells being operated on by a corresponding number of multi-pass sense modules 480. A page controller 498 supplies control and timing signals to each of the sense modules. The page controller 498 cycles each of the multi-pass sense module 480 through a predetermined number of passes (j=1 to N) and also supplies a predetermined demarcation current value I0(j) for each pass. As is well known in the arts, the demarcation current value can also be implemented as a demarcation threshold voltage, or time period for sensing. After the last pass, the page controller 498 enables a transfer gate 488 with a signal NCO to read the state of the sense node 481 as sensed data to a readout bus 499. In all, a page of sense data will be read out from all the multi-pass sense modules 480.

In order to increase read performance, a page of memory cells is sensed in parallel. However, operating a large number of cells in parallel will also consume a large amount of current. A number of issues arise from operating with large amount of current. Generally, it is always desirable to have a device consuming less power. In particular, components having to accommodate higher current will likely be more bulky and take up valuable chip space. Often, the memory device is designed for the worse-case current while most of the time much less current is operating. This is because the current is dependent on the data programmed into the cells, with the less programmed cells having higher conduction currents.

Another issue has to do with an error introduced by a finite resistance between the source line and the ground pad of the chip. One potential problem with sensing memory cells is source line bias caused by source loading across the finite resistance. When a large number memory cells are sensed in parallel, their combined currents can result in significant voltage drop in a ground loop with finite resistance. This results in a source line bias which causes error in a read operation employing threshold voltage sensing.

Figure 11:
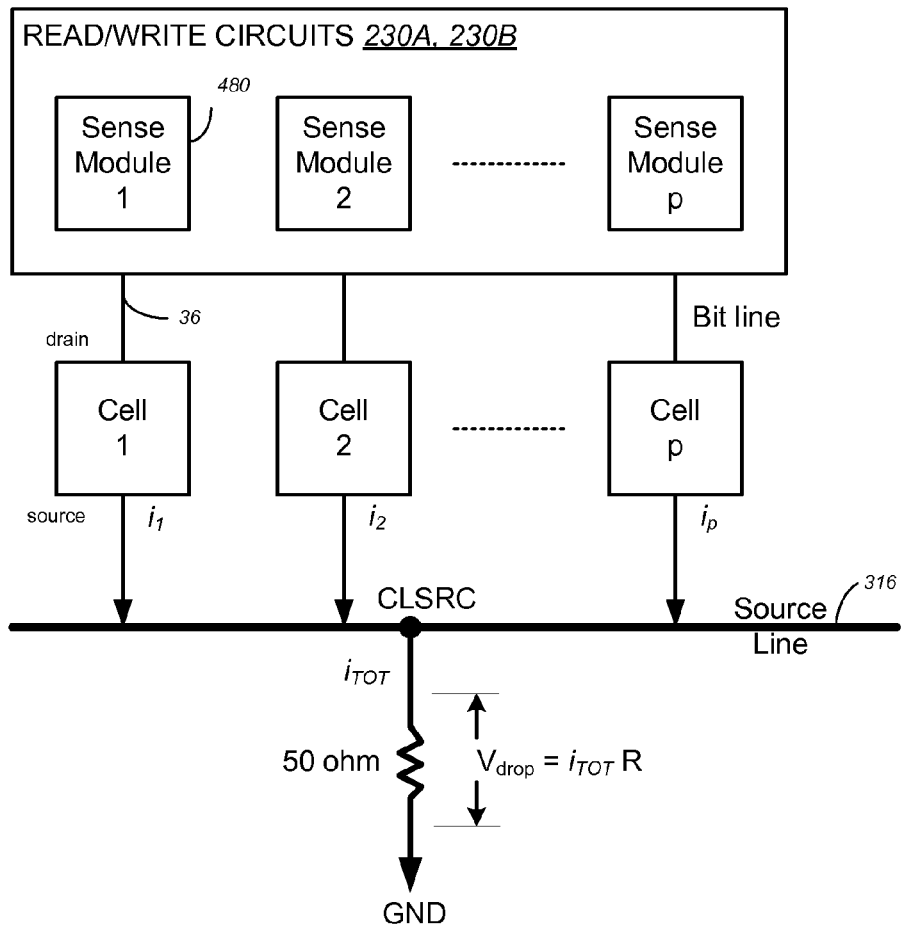
FIG. 11 is a block diagram of read/write circuits and memory cells.

FIG. 11 illustrates the problem of source voltage error due to current flow in the source line having a finite resistance to ground. The read/write circuits 230A and 230B operate on a page of memory cells simultaneously. Each sense module 480 in the read/write circuits is coupled to a corresponding memory cell via a bit line. For example, a sense module 480 senses the conduction current $i_1$ (source-drain current) of a memory cell 1. The conduction current flows from the sense module through the bit line into the drain of the memory cell 1 and out from the source before going through a source line 314 to ground. In an integrated circuit chip, the sources of the cells in a memory array are all tied together as multiple branches of the source line 314 connected to some external ground pad (e.g. Vss pad) of the memory chip. Even when metal strapping is used to reduce the resistance of the source line, a finite resistance, R, remains between the source electrode of a memory cell and the ground pad. Typically, the ground loop resistance R is around 50 ohm.

For the entire page of memory being sensed in parallel, the total current flowing through the source line 314 is the sum of all the conduction currents, i.e. iTOT=i1+i2+..., +ip. Generally, each memory cell (Cell 1, Cell 2, ...Cell P) has a conduction current dependent on the amount of charge programmed into its charge storage element. For a given control gate voltage of the memory cell, a small charge will yield a comparatively higher conduction current. When a finite resistance exists between the source electrode of a memory cell and the ground pad, the voltage drop across the resistance is given by Vdrop=iTOT R. This source line bias can contribute to a sensing error when threshold voltages of the memory cells are sensed.

Figure 12:
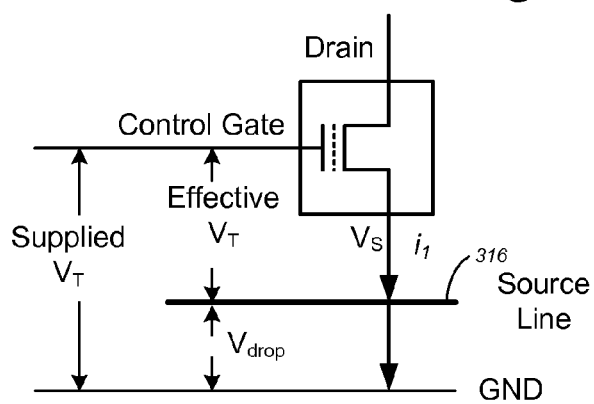
FIG. 12 is a schematic diagram of a cell current discriminator circuit.

FIG. 12 illustrates the error in the threshold voltage level of a memory cell caused by a source line voltage drop. The threshold voltage $V_T$ supplied to the Control Gate of the memory cell 1 is relative to GND. However, the effective $V_T$ seen by the memory cell is the voltage difference between its Control Gate and source line 314. There is a difference of approximately 1.5×Vdrop between the supplied and effective $V_T$ (ignoring the smaller contribution of voltage drop from the source 314 to the source line.) This Vdrop or source line bias will contribute to a sensing error when threshold voltages of the memory cells are sensed. This bias cannot be easily removed as it is data-dependent, i.e., dependent on the memory states of the memory cells of the page.

The error the error in the threshold voltage level of a memory cell caused by a source line voltage drop can be compensated for by performing two passes during a read operation. A read operation can include more than one pass or sub-cycle to resolve the memory states of all the cells in the page. In one aspect, a first pass or sub-cycle senses and identifies as much as possible those memory cells among the page with the highest conduction currents. This will minimize any errors in sensing during a subsequent sub-cycle due to the presence of these high currents cells. Since these cells have already been read, their conduction currents are turned off to save power. The cells are turned off by grounding their associated bit lines so that there is substantially no potential difference across the source and drain of each cell. In a subsequent pass or sub-cycle, the remaining memory cells of the page will be sensed again in parallel with reduced interference from the higher current cells. Thus, relative to each demarcation threshold voltage to distinguish between two adjacent memory states, at least two sensing passes are performed. The first pass or sub-cycle is to identify the high current cells with threshold voltages below the demarcation level. The second pass or sub-cycle is to repeat the sensing after having the high current cells turned off by locking out their bit lines to a ground potential. This technique will be discussed in more detail below.

Figure 13:
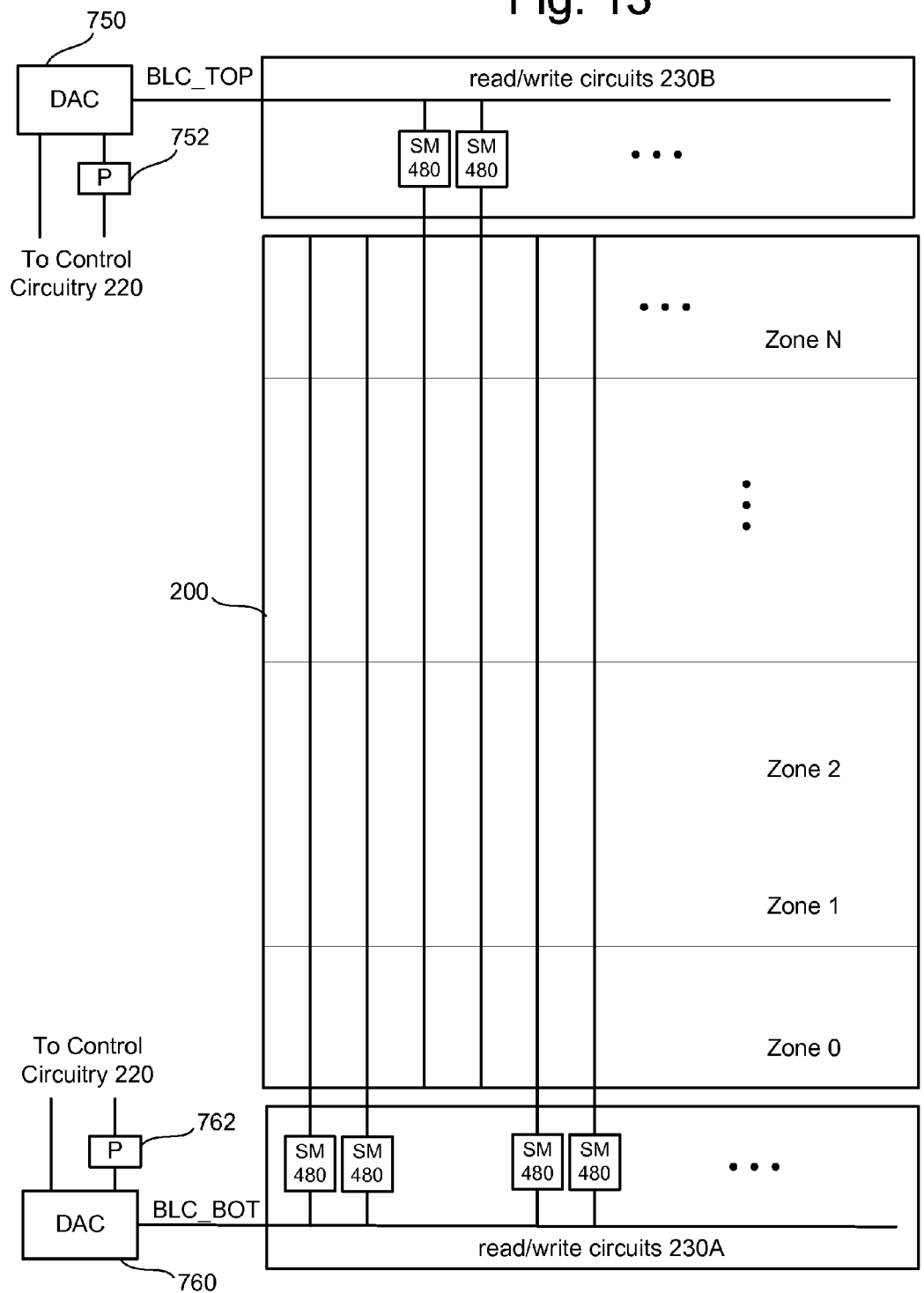
FIG. 13 depicts one example of a memory cell.

Looking back at FIG. 4, access to the memory array 200 by the various peripheral circuits is implemented in a symmetric fashion, on opposite sides of the array, so that the densities of access lines and circuitry on each side are reduced by half. Thus, the row decoder is split into row decoders 240A and 240B and the column decoder into column decoders 242A and 242B. Similarly, the read/write circuits are split into read/write circuits 230A connecting to bit lines from the bottom and read/write circuits 230B connecting to bit lines from the top of the array 200. In this way, the density of the read/write modules is essentially reduced by one half. FIG. 13 shows read/write circuits 230A connecting to bit lines from the bottom of the array 200 and read/write circuits 230B connecting to bit lines from the top of the array 200. In one example arrangement depicted in FIG. 13, two consecutive bit lines are connected to Sense Modules 480 on the bottom of the array (in read/write circuits 230A), the next two consecutive bit lines are connected to Sense Modules 480 on the top of the array (in read/write circuits 230B), the next two consecutive bit lines are connected to Sense Modules 480 on the bottom of the array (in read/write circuits 230A), the next two consecutive bit lines are connected to Sense Modules 480 on the top of the array (in read/write circuits 230B), and so on. Other arrangements can also be used, for example, eight (or another number) consecutive bit lines can be grouped on top/bottom.

One issue with having some of the Sense Modules on top of the array and other Sense Modules on the bottom of the array is that the line length of the bit line from the Sense Module to the word line selected for reading (and, therefore, to the memory cells selected for reading) is different based on whether the Sense Modules are on the top of bottom. Because different memory cells will have different bit line lengths to the Sense Module and the bit lines resistance is based on length of the bit line, the memory cells may experience different voltage drops due to different bit line resistances.

In order to read data from a memory cell, the bit line is pre-charged to a voltage appropriate for reading the memory cell. If the Sense Module is far from the memory cell, the pre-charge voltage has to be increased to account for the voltage drop due to bit line resistance. If a word line selected for reading is close to the bottom of the array 200, then those memory cells connected to Sense Modules 480 in Read/Write Circuits 230A at the bottom of the array 200 will experience a lower voltage drop due to bit line resistance and those memory cells connected to Sense Modules 480 in Read/Write Circuits 230B at the top of the array 200 will experience a higher voltage drop due to bit line resistance. If all Sense Modules are tuned to provide the same pre-charge voltage, then that pre-charge voltage must be large enough to account for the larger voltage drop of the memory cells connected to Sense Modules 480 in Read/Write Circuits 230B at the top of the array 200. This conditions causes Sense Modules 480 in Read/Write Circuits 230A at the bottom of the array 200 to apply a larger voltage than necessary. As discussed above, it is desirable to reduce bit line voltages. Therefore, one embodiment will have the Sense Modules 480 concurrently drive different voltages on the respective bit lines based on how far the selected word line (and, therefore, the selected memory cells) is from the respective Sense Modules.

In one embodiment, the Sense Module 480 in Read/Write Circuits 230A at the bottom of the array 200 will provide a first bit line voltage while the Sense Module 480 in Read/Write Circuits 230B at the top of the array 200 will provide a second bit line voltage. In other embodiments, the Sense Modules can be individually tuned to provide individual bit line voltages. Other arrangements can also be used.

FIG. 10 shows Digital-To-Analog Converter ("DAC") 750 and DAC 760. The DACs provide an analog voltage signal that can be varied based on one or more control signals. In other embodiments, more or less than two DACs can be used. DAC 750 provides a signal BLC_TOP to the BLC input (see FIG. 8) of Sense Modules 480 in Read/Write Circuits 230B. The signal BLC_TOP determines the voltage applied to the bit lines by the respective Sense Modules 480 in Read/Write Circuits 230B. DAC 760 provides a signal BLC_BOT to the BLC input of Sense Modules 480 in Read/Write Circuits 230A. The signal BLC_BOT determines the voltage applied to the bit lines by the respective Sense Modules 480 in Read/Write Circuits 230A. DAC 750 is in communication with Control Circuitry 220 and a parameter 752. In one embodiment, parameter 752 is stored in a register that can be set by Control Circuitry 220. DAC 760 is in communication with Control Circuitry 220 and a parameter 762. In one embodiment, parameter 762 is stored in a register that can be set by Control Circuitry 220. DAC 750 sets the level of BLC_TOP based on parameter 752. DAC 760 sets the level of BLC_BOT based on parameter 762. In one implementation, DAC 750 asserts BLC_TOP while DAC 760 asserts BLC_BOT, and the Sense Modules all assert their respective bit line voltages at the same time. Control Circuitry 220 sets parameter 752 and parameter 762 based on the distance of the selected word line from the top and bottom Sense Modules.

In one alternative, both DAC 750 and DAC 760 can read the same parameter and determine their output voltages based on that one parameter. For example, the parameter may indicate which DAC should produce the higher voltage output.

In one embodiment, Control Circuitry 220 can calculate how far the selected word line is from Read/Write Circuits 230A and Read/Write Circuits 230B, and set parameters 752 and 762 accordingly. One alternative is for Control Circuitry 220 to have a table that associates parameter values with word line location so that the Control Circuitry 220 need not waste time calculating distance.

In another embodiment, memory array 200 can be broken into zones. In one implementation, each zone includes one or more blocks. For example, an array of 2000 blocks can be grouped into ten zones of two hundred blocks each. Other groupings can also be used. For example, FIG. 13 shows memory array 200 grouped into N zones. Zone 0 is closest to Read/Write Circuits 230A. Zone N is closest to Read/Write Circuits 230B. Each zone can be associated with a parameter that specifies the bit line voltages for bit lines connected to Read/Write Circuits 230A and a parameter that specifies the bit line voltages for bit lines connected to Read/Write Circuits 230B.

For example, it may be possible to use a bit line voltage of 150 mV. If a word line is selected for reading from zone 0, the Sense Modules in Read/Write Circuits 230A may drive 150 mV on to the respective connected bit lines while the Sense Modules in Read/Write Circuits 230B may drive 162 mV on to the respective connected bit lines. If a word line is selected for reading from zone N, the Sense Modules in Read/Write Circuits 230A may drive 162 mV on to the respective connected bit lines while the Sense Modules in Read/Write Circuits 230B may drive 150 mV on to the respective connected bit lines. If a word line is selected for reading from zone N/2, the Sense Modules in Read/Write Circuits 230A may drive 156 mV on to the respective connected bit lines while the Sense Modules in Read/Write Circuits 230B may drive 156 mV on to the respective connected bit lines. If a word line is selected for reading from zone N/4, the Sense Modules in Read/Write Circuits 230A may drive 153 mV on to the respective connected bit lines while the Sense Modules in Read/Write Circuits 230B may drive 159 mV on to the respective connected bit lines. The closer the word line is to the top of the array, the lower the voltage driven on bit lines connected to Read/Write Circuits 230B and the higher the voltage driven on bit lines connected to Read/Write Circuits 230A. In one implementation, Control Circuitry 220 stores a table of parameter values for each zone. Therefore, knowing location of the word line or memory cell allows for a determination of the appropriate bit line voltage. Other methods for calculating the parameters can also be used.

In memory arrays that connect eight consecutive bit lines to the Sense Modules at the top of the array, connect the next eight consecutive bit lines to the Sense Modules at the bottom of the array, and so on, it may be desirable to provide a particular bit line voltage for bit lines who have both neighbors connected to the same side of the array and provide a different bit line voltage to bit lines who have neighbors connected to different sides of the array (border bit lines). Each side of the array would have two DACs to provide the different voltages. This arrangement is done to compensate for bit line to bit line capacitive coupling that will effect the voltage of the border bit lines. Bit lines who have neighbors connected to different sides of the array need a higher bit line voltage to compensate for the bit line to bit line capacitive coupling. Having large groups of consecutive bit lines connected to the same side reduces the number of bit lines who have neighbors connected to different sides of the array, thereby allowing for more bit lines with lower voltages. In some alternatives, Sense Module may be placed in more than two locations, therefore, requiring more than two bit line voltages to be applied.

Figure 14:
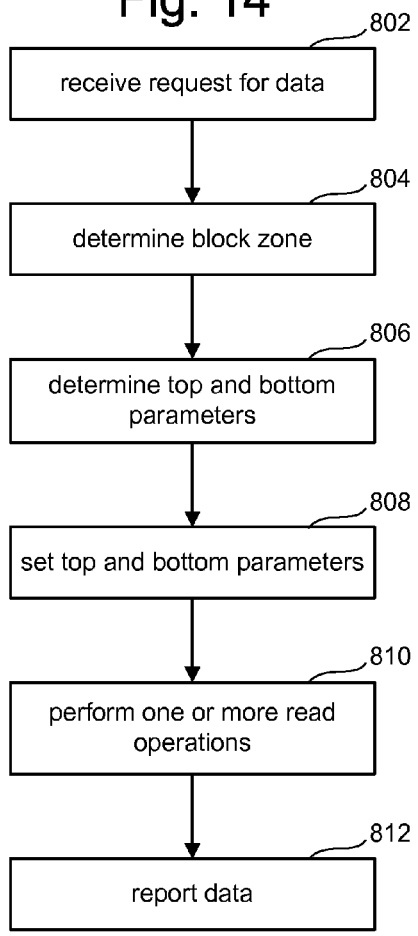
FIG. 14 is a flow chart describing one embodiment of a process for reading data.

FIG. 14 is a flow chart describing one embodiment of a parallel process for reading data. In step 802, a request for data to be read is received. The request can be received from a host, a user, controller or other entity. The request is received at Control Circuitry 220. In one alternative, the request is received at the Controller 244. In some embodiments, step 802 can be skipped and the read process can be performed without a request. For example, the read process may be used to verify programming.

In step 804, Control Circuitry 220 determines what zone the selected word line is in. In one embodiment, a request to read data or a verify operation includes an address of the data to be read. Control Circuitry 220 (or Controller 244) can determine which block includes the word line connected to the memory cells at that address. Once knowing the block, the zone can then be determined. Once the zone is known, the appropriate parameters can be determined in step 806. For example, top parameter 752 and bottom parameter 762 can be determined using a table that correlates zones to parameters. In step 808, the parameters are set by, for example, storing the parameters in registers. In step 810, one or more parallel read operations are performed using the parameters set in step 808. In step 812, the data read in the one or more parallel read operations is reported to the controller, host, user, and/or other entity.

Figure 15:
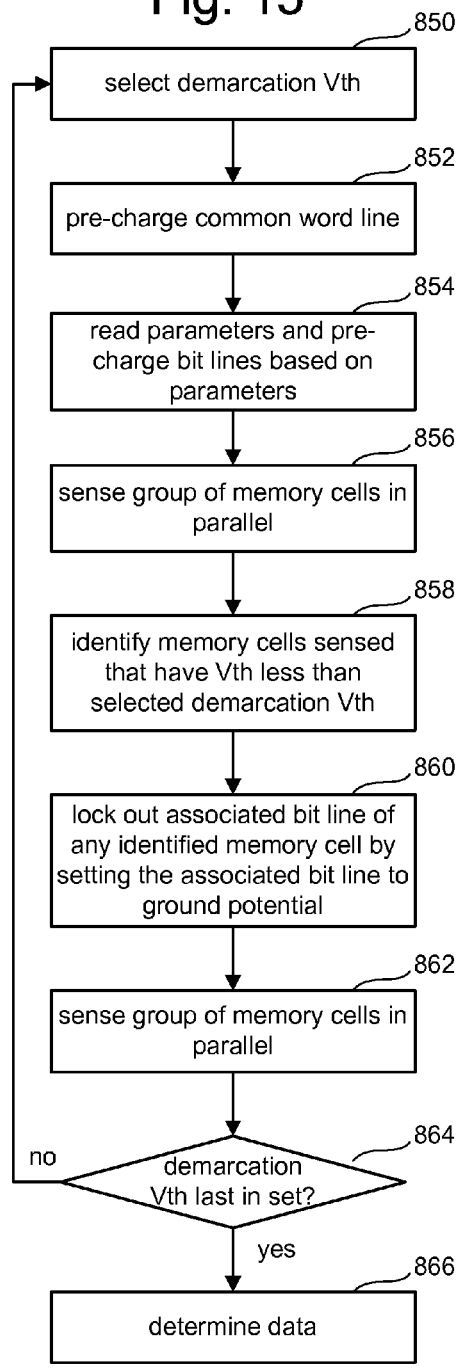
FIG. 15 is a flow chart describing one embodiment of a process for performing one or more read operations.

FIG. 15 is a flow chart describing one embodiment of a process for performing one or more read operations (see step 810 of FIG. 14). Each read operation reads multiple memory cells at the same time. In one embodiment, the memory cells are connected to the same word line. In step 850, a demarcation Vth is selected. As described above, a read process may need to perform sensing operations at multiple compare points to determine which state the memory cell is in. Each of the compare points is a demarcation threshold voltage (Vth). For example, when verifying, the demarcation Vths includes Vv1, Vv2, Vv3, Vv4, Vv5, Vv6 and Vv7. When reading, the demarcation Vths includes Vr1, Vr2, Vr3, Vr4, Vr5, Vr6 and Vr7. In step 850, one of these values is chosen.

In step 852, the selected word line (common to the selected memory cells connected to the top and bottom) is pre-charged to the demarcation Vth. In another embodiment, the selected word line is pre-charged to an intermediate value and then subsequently raised to the demarcation value. In step 854, the parameters are read and the bit lines are simultaneously pre-charged based on the parameters, as explained above. Some bit lines will get the higher bit line voltage. Some bit lines will get the lower bit line voltage. Step 854 includes reading the parameters, generating BLC_TOP and BLC_BOT based on those parameters, and asserting the two or more bit line voltages based on BLC_TOP and BLC_BOT. In step 856, the selected memory cells connected to the selected word line will be sensed (first pass) during the same time period to see if their respective threshold voltage is less than the demarcation Vth. In step 858, the memory cells that have a threshold voltage less than the demarcation Vth are identified. In step 860, the bit lines associated with the memory cells that have a threshold voltage less than the demarcation Vth are locked out from the second pass by setting those bit lines to ground potential. In step 862, the selected memory cells that have not been locked out will be sensed (second pass) to see if their respective threshold voltage is less than the demarcation Vth. If there are more demarcation Vths to consider (step 864), then the process continues at step 850 and the next demarcation Vth is considered. If there are no more demarcation Vths to consider (step 864), then the process continues at step 866 and the data values are determined based on which state the memory cells are in.

Figure 16:
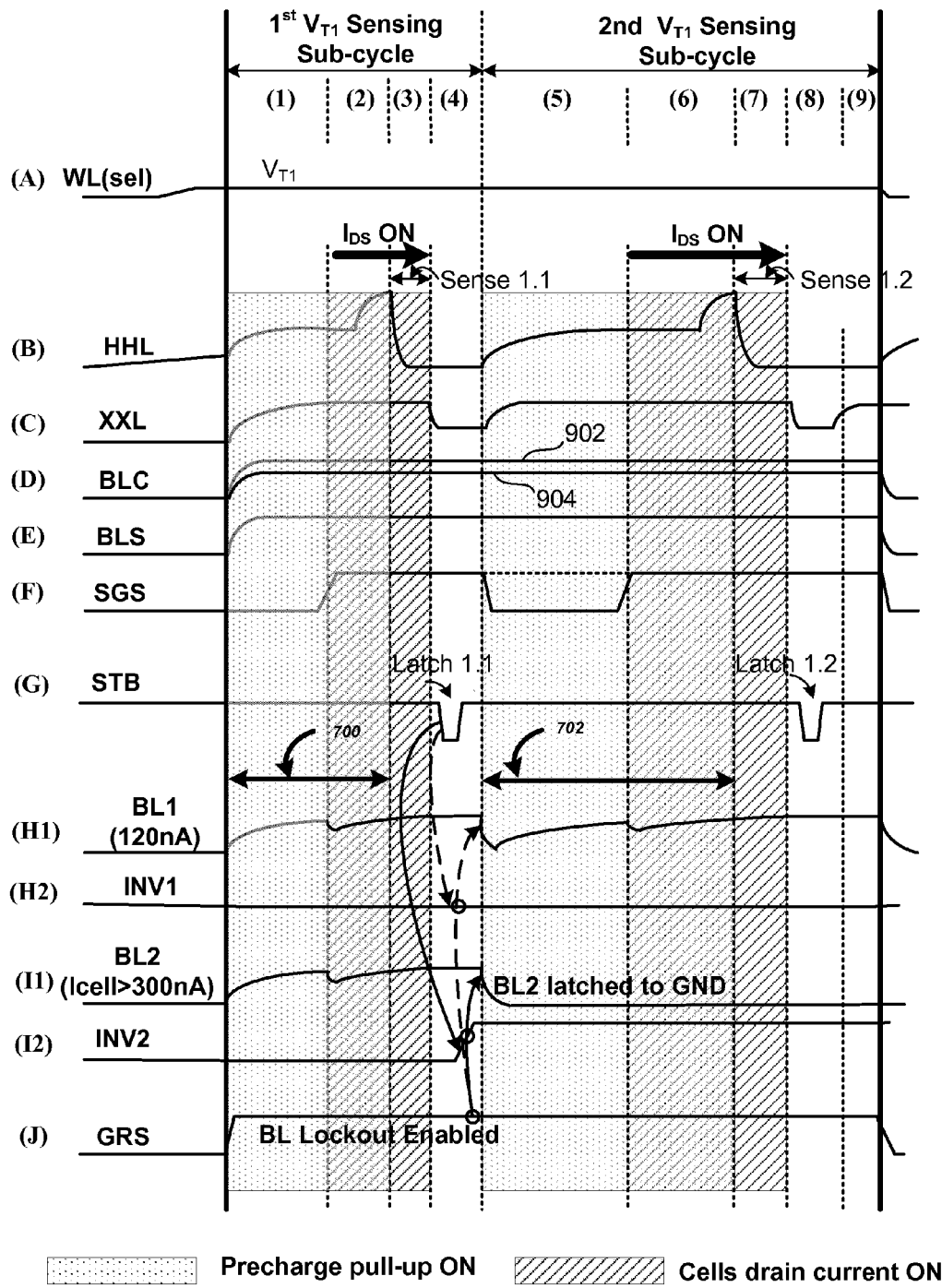
FIG. 16 is a signal diagram.

FIG. 16 is a signal diagram illustrating the behavior of various signal during a read operation that has a first pass and a second pass, as explained above. FIG. 16 shows 9 phases, with phases (1)-(4) being the first pass and phases (5)-(9) being the second phase. The technology described herein also works with read operations that only include one pass, which would include phases (5)-(9) or a variation thereof.

In particular, FIGS. 16(A)-16(J) are timing diagrams for signals that control the operation of the sense module 480 shown in FIG. 8. The overall scheme is to sense the page of memory cells in parallel relative to a given reference threshold level or reference conduction current. As described earlier, the sensing of the threshold voltage in a memory cell relative to a demarcation threshold level can be accomplished by determining the conduction current in the cell relative to a reference current. A cell with a threshold voltage lower than the demarcation threshold level will have its conduction current higher than the reference current. Thus, if the sensing cycles progress with a next demarcation threshold level in ascending order, then each sensing cycle will be to differentiate those cells with conduction current lower than the reference conduction current.

U.S. Pat. No. 7,196,931 discloses a method of reducing source bias error by a 2-pass sensing cycle. The 2-pass sensing cycle has the first pass identifying those cells with conduction currents substantially high than the reference current. After these cells are identified and turned off, sensing relative to substantially the reference current is performed in a second pass without the interference of the high current cells.

Each sensing relative to a reference threshold voltage therefore includes at least two sub-cycles, respectively shown as Phases (1)-(4) and Phases (5)-(9), with each sub-cycle being a pass at sensing the page of memory cells in parallel. Each sensing sub-cycle requires a setup to have the word lines and bit lines set to appropriate voltages before sensing can take place. This accomplished by a pre-charge operation.

The pre-charge operation for the first sub-cycle is between Phase (1)-(2) and that for the second sub-cycle is between Phase (5)-(6).

FIG. 16(A) shows the timing of the pre-charge of the selected word line. If the sensing is relative to a demarcation threshold voltage level of VT1, the word line begins pre-charging to this voltage level. The word line pre-charge may start earlier than that of the bit lines depending on the RC delay of the word line relative to that of the bit lines.

The pre-charge of the bit lines can take place with or without the memory cells coupled to the bit lines. In one embodiment, the cells are initially decoupled from the bit lines so that their drain currents do not work against the pull up of the bit lines This is accomplished by connecting the pre-charge circuit to the bit line via the isolation transistor 478 with the signal BLS HIGH (FIG. 16(E)) and cutting off the NAND chain to the source with SGS LOW (FIG. 16(F)). The pre-charge/clamp circuit 640 (see FIG. 8) is coupled in by turning on the signal HHL to HIGH (FIG. 16(B)). In this way, the bit lines will start to get pulled up (e.g., FIGS. 16(H1) and 16(I1) shows two bit line voltages during the same time period). As discussed above, if the bit lines BL1 is connected to a Sense Module 480 on top and BLs is connected to a Sense Module 480 on bottom, then BL1 will be charged to a first voltage while BL2 is charged to a second voltage based on the appropriate parameters 752 and 762.

When the bit lines have been charged up close to their targeted value, Phase (2) of the bit-line pre-charge will commence. In Phase (2), the pre-charge continues, but with the cells coupled to the bit lines in order to allow the bit lines voltage to be stabilized under the condition for sensing. The total pre-charge period during the first pass of sub-cycle is denoted by a pre-charge period 700.

FIG. 16(D) shows BLC be raised to a target voltage during the Phase (1) based on the appropriate parameter, and holding there until the end of Phase (9). FIG. 16(D) shows line 902, which is a higher voltage provided to the Sense Modules that are further from the selected word line WL(sel). FIG. 16(D) shows line 904, which is a lower voltage provided to the Sense Modules that are closer from the selected word line WL(sel). In response to a higher BLC voltage, Sense Modules 480 drive a higher bit line voltage. In response to a lower BLC voltage, Sense Modules 480 drive a lower bit line voltage.

This embodiment with the bit line initially decoupled from the cell is only preferable if after coupling is allowed it does not incur a long waiting period for the bit line voltage to stabilize. Otherwise, it will be more preferable to have another embodiment in which Phase (1) is not performed and the bit-line pre-charge simply starts with Phase (2) where the bit lines are pre-charged against the conduction current of the cells.

Sensing takes place in Phase (3). As described earlier, in the first sensing sub-cycle, the high current cells are identified. Thus, the sensing is relative to a reference threshold which may be at a margin from that to be used in the next sensing sub-cycle. In other words, the first sub-cycle may use a demarcation current at a margin above that of next sub-cycle. In one embodiment, this is accomplished by shortening the discharge time of the capacitor 652 in the cell current discriminator 650 (see FIG. 10) of the sense module 480. The signal HHL controls the transistor 632 (see FIG. 8) that couples or decouples the pre-charge circuit to the SEN node and therefore the cell current discriminator 650. On the other hand, the signal XXL controls the transistor 630 that couples or decouples the bit line from the SEN node. At the beginning of Phase (3), the signal HHL becomes LOW (FIG. 16(B)), thereby terminating the pre-charge and the conduction current of the cell will discharge the capacitor 652. The end of the discharging period is controlled by XXL going LOW at the end of Phase (3), thereby cutting off the current by decoupling the bit line from the SEN node. It can be seen from the cell current discriminator 650 shown in FIG. 10 that a demarcation current level to be discriminated upon is related to the discharge time, with a longer discharge time yielding a smaller demarcation current level.

In Phase (4), the voltage of the discharged capacitor is then compared relative to the threshold voltage of the p-transistor 656 (see FIG. 10) and the result is latched by the strobe signal STB. The increase margin described above is then accomplished by shortening the sensing period in Phase (3). In this way, only the highest currents will have been able to discharge the capacitor in the shortened period to trip the p-transistor 656.

After the first sub-cycle has identified the high current cells, they are then latched and turned off before the next sensing. This is accomplished by virtue of those high current cells having a sensed result of INV=HIGH. Cells with relatively smaller currents will have INV=LOW.

Memory cells with the relatively larger currents (e.g., greater than 300 nA, see FIG. 16(I1)) will have the signal INV (shown as INV2 in FIG. 16(I2)) latched at HIGH. This is used to activate the pull-down circuit 550 shown in FIG. 8. When the pull-down circuit is enabled by the GRS signal HIGH (FIG. 16(J)), then whenever INV is HIGH, the pull-down circuit 550 will pull the bit line via the enabled isolation transistor 478 (see FIG. 16(E)) to ground. Thus, the bit lines of the cells sensed to have relatively larger currents will be locked out to ground, thereby shutting down those cells.

In the second pass of the sensing or the next sensing sub-cycle as represented by Phases (5)-(9), the process is similar to the first sub-cycle. The pre-charge period 702 takes place in Phases (5)-(6). The sensing in Phase (7) takes place after the voltages in the bit lines have stabilized with the displacement currents decayed to some insignificant value. The strobing and latching take place at Phase (8) and any other high current states missed in the first pass will also have their associated bit lines lockout to ground similar to that shown in FIG. 16(I2) in previous Phase (4). In Phase (9), the sensed results in the form of the signal SEN which is essentially the inversion of the signal INV will be transferred out via the readout bus.

Turning off those cells irrelevant to the current sensing by locking out their bit lines to ground will help to reduce the total current iTOT (see FIG. 11). This has two benefits. First it will save power. Secondly, it will reduce the source's ground loop bias error as the Vdrop is reduced with iTOT. Thus, existing sensing techniques have been implementing this two-pass sensing relative to every memory state.

The above discussion focuses on applying different bit line voltages during read operations. However, the same concepts can be used to apply different bit line voltages during programming and/or to apply different word line voltages based on distance from the source of the voltage.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage apparatus, comprising:
   a plurality of bit lines including a first set of one or more of said bit lines and a second set of one or more of said bit lines;
   non-volatile storage elements including a first group of one or more non-volatile storage elements connected to said first set of one or more bit lines and a second group of one or more non-volatile storage elements connected to said second set of one or more bit lines; and
   a plurality of bit line interface circuits including a first group of one or more bit line interface circuits connected to said first set of one or more bit lines and a second group of one or more bit line interface circuits connected to said second set of one or more bit lines, said first group of one or more bit line interface circuits provide a first signal to said first set of one or more bit lines based on distance of said first group of one or more non-volatile storage elements from said first group of one or more bit line interface circuits, said second group of one or more bit line interface circuits provide a second signal to said second set of one or more bit lines based on distance of said second group of one or more non-volatile storage elements from said second group of one or more bit line interface circuits.

2. A non-volatile storage apparatus according to claim 1, wherein:
   said distance of said first group of one or more non-volatile storage elements from said first group of one or more bit line interface circuits is based on line length along said first set of one or more bit lines; and
   said distance of said second group of one or more non-volatile storage elements from said second group of one or more bit line interface circuits is based on line length along said second set of one or more bit lines.

3. A non-volatile storage apparatus according to claim 1, wherein:
   first group of one or more non-volatile storage elements and said second group of one or more non-volatile storage elements are in an array of non-volatile storage elements, said array of non-volatile storage elements includes a plurality of zones; and
   said distance of said first group of one or more non-volatile storage elements from said first group of one or more bit line interface circuits is based on which zone of said plurality of zones said first group of one or more non-volatile storage elements and said second group of one or more non-volatile storage elements are located in.

4. A non-volatile storage apparatus according to claim 1, wherein:
   said first group of one or more non-volatile storage elements and said second group of one or more non-volatile storage elements are connected to a common word line.

5. A non-volatile storage apparatus according to claim 1, wherein:
   said first group of one or more bit line interface circuits provide said first signal to said first set of said bit lines during a particular read operation;
   said second group of one or more bit line interface circuits provide said second signal to said second set of said bit lines during said particular read operation; and
   said particular read operation senses data in said first group of one or more non-volatile storage elements and said second group of one or more non-volatile storage elements.

6. A non-volatile storage apparatus according to claim 1, wherein:
   said first group of one or more bit line interface circuits provide said first signal to said first set of said bit lines during a particular read operation;
   said second group of one or more bit line interface circuits provide said second signal to said second set of said bit lines during said particular read operation and while said first group of one or more bit line interface circuits provide said first signal;
   said particular read operation senses data in said first group of one or more non-volatile storage elements while sensing data said second group of one or more non-volatile storage elements; and
   said first group of one or more non-volatile storage elements and said second group of one or more non-volatile storage elements are connected to a common word line.

7. A non-volatile storage apparatus according to claim 1, wherein:
   said first signal and said second signal are one or more voltages.

8. A non-volatile storage apparatus according to claim 1, wherein:
   said first group of one or more non-volatile storage elements and said second group of one or more non-volatile storage elements are in an array of non-volatile storage elements;
   said first group of one or more bit line interface circuits are one or more sense modules on a first side of said array; and
   said second group of one or more bit line interface circuits are one or more sense modules on a different side of said array.

9. A non-volatile storage apparatus according to claim 1, further comprising:
   a control circuit;
   a first programmable signal providing circuit in communication with said control circuit and said first group of one or more bit line interface circuits, said first group of one or more bit line interface circuits output said first signal based on said first programmable signal providing circuit; and
   a second programmable signal providing circuit in communication with said control circuit and said second group of one or more bit line interface circuits, said second group of one or more bit line interface circuits output said second signal based on said second programmable signal providing circuit, said control circuit programs said first programmable signal providing circuit and said second programmable signal providing circuit based on distance of said first group of one or more non-volatile storage elements from said first group of one or more bit line interface circuits and distance of said second group of one or more non-volatile storage elements from said second group of one or more bit line interface circuits.

10. A non-volatile storage apparatus according to claim 1, further comprising:
a first storage device;
a first digital-to-analog converter circuit in communication with said first storage device and said first group of one or more bit line interface circuits, said first digital-to-analog converter circuit outputs a first voltage to said first group of one or more bit line interface circuits based on a value stored in said first storage device, said first group of one or more bit line interface circuits output said first signal based on said first voltage;
a second storage device; and
a second digital-to-analog converter circuit in communication with said second storage device and said second group of one or more bit line interface circuits, said second digital-to-analog converter circuit outputs a second voltage to second group of one or more bit line interface circuits based on a value stored in said second storage device, said second group of one or more bit line interface circuits output said second signal based on said second voltage.

11. A non-volatile storage apparatus according to claim 10, wherein:
said first group of one or more non-volatile storage elements and said second group of one or more non-volatile storage elements are in an array of non-volatile storage elements;
said first group of one or more bit line interface circuits are one or more sense modules on a first side of said array;
said second group of one or more bit line interface circuits are one or more sense modules on a different side of said array;
said first signal and said second signals are one or more voltages;
said first group of one or more non-volatile storage elements and said second group of one or more non-volatile storage elements are connected to a common word line;
said first group of one or more bit line interface circuits provide said first signal to said first set of said bit lines during a particular read operation;
said second group of one or more bit line interface circuits provide said second signal to said second set of said bit lines during said particular read operation; and
said particular read operation senses data in said first group of one or more non-volatile storage elements and said second group of one or more non-volatile storage elements.

12. A non-volatile storage apparatus according to claim 1, wherein:
said first group of one or more non-volatile storage elements and said second group of one or more non-volatile storage elements are NAND flash memory devices.

13. A non-volatile storage apparatus according to claim 1, wherein:
said first group of one or more non-volatile storage elements and said second group of one or more non-volatile storage elements are multi-state flash memory devices.

14. A non-volatile storage apparatus, comprising:
a word line;
an array of non-volatile storage elements that includes a first group of non-volatile storage elements connected to said word line and a second group of non-volatile storage elements connected to said word line;
a plurality of bit lines including a first group of bit lines in communication with said first group of non-volatile storage elements and a second group of bit lines in communication with said second group of non-volatile storage elements;
a first set of sense modules connected to said first group of bit lines, said first set of sense modules are located on a first side of said array;
a second set of sense modules connected to said second group of bit lines, said second set of sense modules are located on a different side of said array than said first set of sense modules;
a first control circuit in communication with said first set of sense modules, said first control circuit provides a first signal to said first set of sense modules based on a location of said first group of non-volatile storage elements in said array, said first set of sense modules provide a first voltage to said first group of bit lines based on said first signal; and
a second control circuit in communication with said second set of sense modules, said second control circuit provides a second signal to said second set of sense modules based on a location of said second group of non-volatile storage elements in said array, said second set of sense modules provide a second voltage to said second group of bit lines based on said second signal.

15. A non-volatile storage apparatus according to claim 14, wherein:
said first control circuit and said second control circuit include digital-to-analog converters and registers.

16. A non-volatile storage system, comprising:
a plurality of non-volatile storage elements including a first subset of non-volatile storage elements and a second subset of non-volatile storage elements;
a first set of control lines in communication with said first subset of non-volatile storage elements;
a second set of control lines in communication with said second subset of non-volatile storage elements; and
one or more managing circuits in communication with said non-volatile storage elements, said one or more managing circuits apply a first voltage to said first subset of control lines based on position of said first subset of non-volatile storage elements in said plurality while applying a second voltage to said second set of control lines based on position of said second subset of non-volatile storage elements in said plurality as part of a common read operation, said one or more managing circuits sense data in said first set of selected non-volatile storage elements and said second set of selected non-volatile storage elements during said common read operation.

17. A non-volatile storage apparatus according to claim 16, wherein:
said first subset of non-volatile storage elements and said second subset of non-volatile storage elements are connected to a common word line; and
said first set of control lines and said second set of control lines are bit lines.

18. A non-volatile storage apparatus according to claim 16, wherein:

said one or more managing circuits include a first set of sense modules on a first side of said plurality of non-volatile storage elements and a second set of sense modules on a different side of said plurality of non-volatile storage elements;

said first set of sense modules apply said first voltage; and said second set of sense modules apply said first voltage.

19. A non-volatile storage apparatus according to claim 16, wherein:

said one or more managing circuits sense data in said first set of selected non-volatile storage elements while sensing data in said second set of selected non-volatile storage elements during said common read operation.

20. A non-volatile storage apparatus according to claim 16, wherein:

said non-volatile storage elements are multi-state flash memory devices.

21. A non-volatile storage apparatus, comprising:

a plurality of bit line interface circuits, each bit line interface circuit connects to one of a plurality of bit lines, said plurality of bit line interface circuits are divided into at least a first group of bit line interface circuits connected to a first set of bit lines and a second group of bit line interface circuits connected to a second set of bit lines;

a first variable signal providing circuit in communication with said first group of bit line interface circuits, said first variable signal providing circuit provides a first signal to said first group of bit line interface circuits based on a location of non-volatile storage elements associated with said first group of bit line interface circuits that have been selected for a read operation, said first group of bit line interface circuits provide a first bit line signal to said first set of bit lines based on said first signal; and a second variable signal providing circuit in communication with said second group of bit line interface circuits, said second signal voltage providing circuit provides a second signal to said second group of bit line interface circuits based on a location of non-volatile storage elements associated with said second group of bit line interface circuits that have been selected for said read operation, said second group of bit line interface circuits provide a second bit line signal to said second set of bit lines based on said second signal.

22. A non-volatile storage apparatus according to claim 21, wherein:

said first signal, said second signal, said first bit line signal and said second bit line signal are voltage signals.

23. A non-volatile storage apparatus according to claim 21, wherein:

said first group of bit line interface circuits provide a first bit line signal to said first set of bit lines while said second group of bit line interface circuits provide a second bit line signal to said second set of bit lines.

24. A non-volatile storage apparatus according to claim 21, wherein:

said first variable signal providing circuit and said second variable signal providing circuit include digital-to-analog converters; and said bit line interface circuits are sense modules.

25. A method for operating non-volatile storage, comprising:

providing a first control line signal to a first set of one or more control lines from a first set of one or more control line interface modules based on distance of said first set of one or more control line interface modules from a first set of one or more selected non-volatile storage elements in communication with said first set of one or more control lines;

providing a second control line signal to a second set of one or more control lines from a second set of one or more control line interface modules based on distance of said second set of one or more control line interface modules from a second set of one or more selected non-volatile storage elements in communication with said second set of one or more control lines; and performing a memory operation on said first set of one or more selected non-volatile storage elements and said second set of one or more selected non-volatile storage elements during a common parallel process based on said first control line signal and said second control line signal.

26. A method according to claim 25, wherein:

said first set of one or more control lines are bit lines; and said distance of said first set of one or more control line interface modules from said first set of one or more selected non-volatile storage elements is based on line length along said bit lines from said first set of one or more control line interface modules to said first set of one or more selected non-volatile storage elements.

27. A method according to claim 25, wherein:

said first set of one or more control lines are bit lines;

first set of one or more selected non-volatile storage elements and said second set of one or more selected non-volatile storage elements are in an array of non-volatile storage elements, said array of non-volatile storage elements includes a plurality of zones; and said distance of said first set of one or more control line interface modules from said first set of one or more selected non-volatile storage elements is based on which zone of said plurality of zones said first set of one or more selected non-volatile storage elements and said second set of one or more selected non-volatile storage elements are located in.

28. A method according to claim 25, further comprising:

accessing an address for a read operation;

identifying a particular zone that includes said address, said particular zone is identified from a plurality of zones in an array of non-volatile storage elements that includes said first set of one or more selected non-volatile storage elements and said second set of one or more selected non-volatile storage elements;

setting one or more parameters based on said particular zone;

using said one or more parameters to generate a first voltage and a second voltage;

providing said first voltage to said first set of one or more control line interface modules, said first set of one or more control line interface modules provides said first control line signal based on said first voltage; and providing said second voltage to said second set of one or more control line interface modules, said second set of one or more control line interface modules provides said second control line signal based on said second voltage.

29. A method according to claim 25, wherein:

said first set of one or more control lines are bit lines;

said second set of one or more control lines are bit lines; and said memory operation is a read operation.

30. A method according to claim 29, wherein:
said first set of one or more selected non-volatile storage elements and said second set of one or more selected non-volatile storage elements are connected to a common word line.

31. A method according to claim 29, wherein:
said providing a first control line signal and providing a second control line signal are performed in parallel.

32. A method according to claim 29, wherein:
said first control line signal is a bit line voltage; and
said second control line signal is a bit line voltage.

33. A method according to claim 29, wherein:
said first set of one or more selected non-volatile storage elements and said second set of one or more selected non-volatile storage elements are in an array of non-volatile storage elements and are connected to a common word line;
said providing a first control line signal is performed by a first set of one or more sense modules on a first side of said array; and
said providing a second control line signal is performed by a second set of one or more sense modules on a different side of said array.

34. A method according to claim 33, further comprising:
said first control line signal is a bit line voltage;
said second control line signal is a bit line voltage;
said providing a first control line signal and providing a second control line signal are performed in parallel; and
said first set of one or more selected non-volatile storage elements and said second set of one or more selected non-volatile storage elements are connected to a common word line.

35. A method according to claim 29, further comprising:
receiving a request to read data, said memory operation includes reporting said data.

36. A method according to claim 29, wherein:
said read operation is performed in order to verify programming.

37. A method according to claim 29, wherein:
said read operation is performed in response to a request for data.

38. A method according to claim 25, wherein:
said first set of one or more selected non-volatile storage elements and said second set of one or more selected non-volatile storage elements are NAND flash memory devices.

39. A method according to claim 25, wherein:
said first set of one or more selected non-volatile storage elements and said second set of one or more selected non-volatile storage elements are multi-state flash memory devices.

40. A method for operating non-volatile storage, comprising:
providing a first bit line voltage to a first set of bit lines from a first set of bit line interface modules based on distance along said first set of bit lines between said first set of bit line interface modules and a first set of selected non-volatile storage elements in communication with said first set of bit lines;
providing a second bit line voltage to a second set of bit lines from a second set of bit line interface modules based on distance along said second set of bit lines between said second set of bit line interface modules and a second set of selected non-volatile storage elements in communication with said second set of bit lines, said second bit line voltage is provided to said second set of bit lines and said first bit line voltage is provided to said first set of bit lines as part of a common read process for said first set of selected non-volatile storage elements and said second set of selected non-volatile storage elements; and
sensing data in said first set of selected non-volatile storage elements and said second set of selected non-volatile storage elements during said common read process.

41. A method according to claim 40, wherein:
said first set of one or more selected non-volatile storage elements and said second set of one or more selected non-volatile storage elements are connected to a common word line.

42. A method according to claim 40, wherein:
said second bit line voltage is provided to said second set of bit lines while said first bit line voltage is provided to said first set of bit lines; and
said sensing data includes sensing data in said first set of selected non-volatile storage elements while sensing data in said second set of selected non-volatile storage elements.

43. A method according to claim 40, wherein:
said first set of selected non-volatile storage elements and said second set of selected non-volatile storage elements are in an array of non-volatile storage elements and are connected to a common word line;
said providing a first bit line voltage is performed by a first set of one or more sense modules on a first side of said array; and
said providing a second bit line voltage is performed by a second set of one or more sense modules on a different side of said array.

44. A method according to claim 40, wherein:
said first set of selected non-volatile storage elements and said second set of selected non-volatile storage elements are multi-state NAND flash memory devices.

45. A method for operating non-volatile storage, comprising:
accessing an address for a read operation;
determining a set of two or more bit line voltages based on position in a memory array of a set of non-volatile storage elements associated with said address, said set of two or more bit line voltages includes a first bit line voltage and a second bit line voltage;
storing one or more parameters indicating said two or more bit line voltages;
using said stored parameters to program a first voltage providing circuit and a second voltage providing circuit;
providing said first bit line voltage to a first set of bit lines using said first voltage providing circuit;
providing said second bit line voltage to a second set of bit lines using said second voltage providing circuit in a manner that overlaps in time with providing said first bit line voltage to said first set of bit lines; and
sensing data in said first set of selected non-volatile storage elements and said second set of selected non-volatile storage elements using said first and second bit line voltages.

46. A method according to claim 45, wherein:
said set of non-volatile storage elements associated with said address are connected to a common word line.

47. A method according to claim 46, wherein said using said stored parameters to program a first voltage providing circuit and a second voltage providing circuit comprise:
using said stored parameters to configure a first digital-to-analog converter to provide a first voltage to said first voltage providing circuit and a second digital-to-analog converter to provide a second voltage to said second voltage providing circuit, said first voltage causes said first voltage providing circuit to provide said first bit line voltage, said second voltage causes said second voltage providing circuit to provide said second bit line voltage, said first voltage providing circuit and said second voltage providing circuit are sense module circuits.

48. A method according to claim 45, wherein:
said providing said first bit line voltage and providing said second bit line voltage are performed in parallel; and
said sensing data includes sensing data in said first set of selected non-volatile storage elements while sensing data in said second set of selected non-volatile storage elements.

49. A method for operating non-volatile storage, comprising:
providing a first bit line voltage to a first set of bit lines in communication with a first set of selected non-volatile storage elements, said first bit line voltage is based on position of said first set of selected non-volatile storage elements in a group of non-volatile storage elements;
providing a second bit line voltage to a second set of bit lines in communication with a second set of selected non-volatile storage elements, said first set of selected non-volatile storage elements are connected to said second set of selected non-volatile storage elements, said second bit line voltage is based on position of said second set of selected non-volatile storage elements in said group of non-volatile storage elements;
sensing data in said first set of selected non-volatile storage elements based on said first bit line voltage; and
sensing data in said second set of selected non-volatile storage elements based on said second bit line voltage while sensing data in said first set of selected non-volatile storage elements based on said first bit line voltage.

* * * * *